United States Patent [19]
Kawamoto et al.

[11] Patent Number: 6,162,752
[45] Date of Patent: Dec. 19, 2000

[54] BARIUM TITANATE POWDER, SEMICONDUCTING CERAMIC, AND SEMICONDUCTING CERAMIC ELECTRONIC ELEMENT

[75] Inventors: Mitsutoshi Kawamoto, Hirakata; Hideaki Niimi, Hikone, both of Japan

[73] Assignee: Murata Manufacturing Co., Ltd., Japan

[21] Appl. No.: 09/309,985

[22] Filed: May 11, 1999

[30] Foreign Application Priority Data

May 12, 1998 [JP] Japan .................................. 10-128853

[51] Int. Cl.$^7$ ................................................. C04B 35/468
[52] U.S. Cl. ............................ 501/137; 501/138; 423/84; 423/598; 252/62.3 BT
[58] Field of Search ..................... 501/137, 138; 423/84, 598; 361/18; 232/62.3 BT

[56] References Cited

U.S. PATENT DOCUMENTS

| | | | |
|---|---|---|---|
| 4,832,939 | 5/1989 | Menashi et al. ........................ | 423/598 |
| 4,863,883 | 9/1989 | Menashi et al. ........................ | 501/138 |

FOREIGN PATENT DOCUMENTS

0908423A1   4/1999   European Pat. Off. .

OTHER PUBLICATIONS

"Dependence of the Grain Boundary Potential Barrier Height of BaTiO$_3$ Ceramics on Donor Dopant Concentration"; J. Illingsworth, et al.; *Journal of Physics D: Applied Physics';* 23 (Jul. 14, 1990) No. 7, Bristol, GB; pp. 971–975.

"Studies on the Preparation of Positive, Temperature Coefficient of Resistivity Powder by Two Chemical Steps"; J. Xue, et al.; *Journal of Materials Science;* vol. 32, No. 22, pp. 6095–6099. (1997) No Month Provided.

*Primary Examiner*—David Brunsman
*Attorney, Agent, or Firm*—Ostrolenk, Faber, Gerb & Soffen, LLP

[57] ABSTRACT

The present invention provides barium titanate powder having a withstanding voltage of 800 V/mm or more and a specific resistance at room temperature of 100 Ω·cm or less, the specific resistance at room temperature undergoing substantially no time-course change. Barium titanate of the powder of the present invention assumes a cubic crystal system. The powder has a particle size of about 0.1 μm or less; the ratio represented by BaCO$_3$/BaO as obtained through XPS is about 0.42 or less; the lattice constant is about 0.4020 nm or more; and the ratio represented by Ba/Ti is about 0.988–0.995.

7 Claims, No Drawings

BARIUM TITANATE POWDER, SEMICONDUCTING CERAMIC, AND SEMICONDUCTING CERAMIC ELECTRONIC ELEMENT

FIELD OF THE INVENTION

The present invention relates to a barium titanate powder, and more particularly, to a barium titanate powder used for producing a semiconducting ceramic having a positive temperature coefficient characteristic.

BACKGROUND OF THE INVENTION

Electronic elements for controlling temperature, limiting current, generating heat at constant temperature and like applications have employed a semiconducting ceramic having a positive temperature coefficient characteristic (hereinafter referred to as a PTC characteristic), wherein the electric resistance thereof drastically increases when temperature elevates beyond the Curie temperature. As such a semiconducting ceramic, barium titanate ceramics have widely been used.

In recent years, there has arisen demand for a semiconducting ceramic electronic element for the above applications which has a high withstand voltage (i.e., high withstanding voltage) and thus can be used at high voltage. Particularly, a semiconducting ceramic element employed in a overcurrent-protecting element for electric circuits must have high withstand voltage.

One known method which is effective for obtaining a semiconducting ceramic having high withstanding voltage is to reduce the particle size of the barium titanate powder serving as a starting material. Therefore, studies have been focused on methods for reducing the particle size. For example, Japanese Patent Publication (kokoku) No. 60-25004 discloses that a semiconducting ceramic having a grain size of 1–5 $\mu$m and a maximum withstanding voltage of 500 V/mm is obtained by crushing and mixing barium titanate and Sb oxide serving as a semiconductivity-imparting agent; calcining under controlled conditions; compacting under controlled conditions; and firing the compact at 1350° C.

However, conventional barium titanate and semiconducting ceramic thereof involve the following drawbacks 1 and 2.

1. In order to effectively reduce specific resistance at room temperature, the barium titanate powder is preferably fired at approximately 1300° C. However, when the powder is fired at such a temperature, barium titanate grains grow to a size of approximately 1–5 $\mu$m, to thereby fail to attain a target withstand voltage; and 2. When the particle size of barium titanate powder decreases to 0.1 $\mu$m or less, the specific resistance of the ceramic at room temperature tends to vary from product to product, and in some cases increases with time (i.e., undergoes changes over time).

SUMMARY OF THE INVENTION

The present invention provides a barium titanate powder which has a withstanding voltage of 800 V/mm or more and a specific resistance at room temperature of 100 $\Omega$·cm or less, the specific resistance at room temperature undergoing substantially no time-course change. The present invention also provides a semiconducting ceramic produced from the barium titanate powder. Still further the present invention provides a semiconducting ceramic electronic element produced From the ceramic.

In a first aspect of the present invention, there is provided a powder of barium titanate of a cubic crystal system and an average particle size of about 0.1 $\mu$m or less, wherein the ratio represented by $BaCO_3/BaO$ as obtained through X-Ray Photoelectron Spectroscopy ("XPS") is about 0.42 or less; the lattice constant is about 0.4020 nm or more; and the ratio represented by Ba/Ti is about 0.988–0.995.

In a second aspect of the present invention, there is provided a semiconducting ceramic which is formed by sintering a semiconducting material containing the barium titanate powder and a semiconductivity-imparting agent. With such a constitution, the grain size of barium titanate remains small even after firing at about 1300° C., so that a semiconducting ceramic possesses a high withstanding voltage and the specific resistance at room temperature can be lowered, the specific resistance at room temperature undergoing substantially no time-course change.

In a third aspect of the present invention, there is provided a semiconducting ceramic electronic element which comprises a semiconducting ceramic referred to in the second aspect of the present invention and electrodes formed thereon. With such a constitution, the semiconducting ceramic electronic element can serve as a thermistor having a PTC characteristic, particularly as an element suitably employed for overcurrent-protection for electric circuits.

DETAILED DESCRIPTION OF THE INVENTION

The barium titanate powder according to the present invention may also include, in addition to a $BaTiO_3$ powder, a powder of barium titanate-based species in which the Ba is partially substituted by Sr, Ca, Pb, Y, a rare earth element, etc., or the Ti is partially substituted by Sn, Zr, Nb, W, Sb, etc.

$MnO_2$, $SiO_2$, $TiO_2$, $Al_2O_3$, etc. may be added in an appropriate amount to a semiconducting material containing barium titanate for producing the semiconducting ceramic according to the present invention.

In the present invention, the expression "substantially no time-course change" refers to a case in which the ratio of specific resistance at room temperature 1000 hours after the termination of firing to that immediately after firing is about 1.05 or less.

The present invention will next be described more specifically by way of examples.

EXAMPLES

Example 1

The following is an example method for producing the barium titanate powder according to -the present invention.

First, there were prepared aqueous solutions of barium hydroxide having a variety of Ba contents and an isopropyl alcohol (hereinafter referred to as IPA) solution of Ti alkoxide represented by $Ti(O-iPr)_4$ having a Ti content of 2.655 mol. Secondly, a solution of lanthanum chloride represented by $LaCl_3 \cdot 6.3\ H_2O$ (2.385 g) dissolved in ethanol (volume of the resultant solution: 100 cc, La content: 0.00664 mol) was homogeneously mixed into the IPA solution of the Ti alkoxide.

Next, each aqueous solution of barium hydroxide and the mixture of the ethanol solution of lanthanum chloride and the IPA solution of the titanium alkoxide were mixed, and the resultant mixture was allowed to react to form a slurry. The slurry was poured into a tank for aging. Subsequently, the aged slurry was dehydrated to form a dehydrated cake, which was dried at 110° C. for three hours. The dried cake was crushed to thereby obtain a La-containing barium titanate powder.

Measurements were performed in order to obtain the particle size of La-containing barium titanate powder, $BaCO_3/BaO$ ratio, Ba/Ti ratio, crystal system, and lattice constant. The particle size, $BaCO_3/BaO$ ratio, Ba/Ti ratio, and crystal system and lattice constant were measured through SEM, XPS, fluorescent X-ray analysis and XRD, respectively. The particle size means an average particle size which was obtained by measuring the diameters of at least ten particles by means of SEM.

In order to form a granulated powder, a binder such as vinyl acetate was added to the thus-obtained La-containing barium titanate powder or to a powder obtained by calcining the above powder at 800–1000° C. for two hours. The granulated powder was molded by way of uniaxial pressing to thereby form a disk-shaped compact having a diameter of 10 mm and a thickness of 1 mm.

Subsequently, the compact was fired in air at 1200–1300° C. for two hours to form a semiconducting ceramic. A paste for producing an In-Ga electrode was applied to the two major surfaces of the semiconducting ceramic, and the entirety thereof was fired to thereby obtain a semiconducting ceramic electronic element.

Specific resistance at room temperature, withstanding voltage, the ratio represented by $BaCO_3/BaO$ at the surface of a semiconducting ceramic the time-course change in the ratio of specific resistance at room temperature with time were measured in semiconducting ceramics having barium hydroxide solutions of various Ba contents for producing the semiconducting ceramic electronic element in the above-described manner. Specific resistance at room temperature was measured at 25° C. by use of a four-point-probe method employing a digital voltmeter. The withstanding voltage was obtained by measuring maximum applied voltage immediately before breakdown of a sample and dividing the voltage by th,e distance between two electrodes attached to the sample. The time-course change ratio of the specific resistance at room temperature represents a ratio of specific resistance at room temperature 1000 hours after the termination of firing to that immediately after firing.

Comparative Examples

To hydrothermally synthesized powders BT-01 and BT-02 (products of Sakai Chemical Industry Co., Ltd.), which were used as barium titanate powder, lanthanum was added in the form of a lanthanum nitrate solution. The resultant mixtures were dried through evaporation to thereby obtain La-containing barium titanate powder. Subsequent steps and measurements were performed in a manner similar to that of Example 1.

The results of the measurements performed in Example 1 and Comparative Examples are shown in Table 1. Samples marked with * fall outside the scope of the present invention. In the column "Ceramic grain size," the entry "1, several tens ($\mu$m)" according to Comparative Examples 1 and 2 refers to dispersion of ceramic grains having a grain size of several tens $\mu$m in ceramic grains having a grain size of 1 $\mu$m.

TABLE 1

| | Physical properties of barium titanate powder | | | | Physical properties of semiconducting ceramic | | | |
| --- | --- | --- | --- | --- | --- | --- | --- | --- |
| Sample No. | Particle size ($\mu$m) | $BaCO_3/BaO$ ratio | Lattice constant (nm) | Ba/Ti ratio | Ceramic grain size ($\mu$m) | Specific resistance at room temperature ($\Omega \cdot 0$ cm) | Withstanding voltage (V/mm) | Time-course change ratio |
| 1 | 0.05 | 0.40 | 0.4025 | 0.991 | 0.8 | 100 | 1000 | 1.03 |
| 2 | 0.05 | 0.42 | 0.4020 | 0.995 | 1.0 | 77 | 833 | 1.02 |
| 3 | 0.05 | 0.37 | 0.4030 | 0.988 | 0.9 | 84 | 925 | 1.05 |
| *4 | 0.05 | 0.48 | 0.4023 | 0.995 | 0.8 | 90 | 825 | 5.0 |
| *5 | 0.05 | 0.42 | 0.4024 | 0.997 | 0.9 | 95 | 840 | 3.5 |
| *6 | 0.05 | 0.40 | 0.4035 | 0.985 | 5.0 | 10 | 230 | 1.01 |
| Comparative Example 1 | 0.1 | 0.38 | 0.4010 | 0.994 | 1, several tens | 500 | 250 | 1.02 |
| Comparative Example 2 | 0.2 | 0.34 | 0.4005 | 0.994 | 1, several tens | 1000 | 200 | 1.01 |

Samples marked with * fall outside the scope of the present invention.

As shown in Table 1, it is confirmed that barium titanate powders having a particle size of about 0.1 $\mu$m or less; a $BaCO_3/BaO$ ratio obtained through XPS of about 0.42 or less; a lattice constant of about 0.4020 nm or more; and a Ba/Ti ratio of about 0.988–0.995 produce semiconducting ceramics having a withstanding voltage of 800 V/mm or more; specific resistance at room temperature of 100 $\Omega \cdot$cm or less; and time-course change ratio thereof of 1.05 or less.

There will next be described the reasons for limiting the particle size of barium titanate powder, $BaCO_3/BaO$ ratio obtained through XPS, lattice constant, and Ba/Ti ratio in the present invention.

When the particle size of the barium titanate powder is in excess of 0.1 $\mu$m as in the case of Comparative Example 2, the specific resistance at room temperature is disadvantageously in excess of 100 $\Omega \cdot$cm and the withstanding voltage is disadvantageously less than 800 V/mm. Thus, the particle size of barium titanate powder is limited to about 0.1 $\mu$m or less.

When the $BaCO_3/BaO$ ratio obtained through XPS is in excess of 0.42 as in the case of Sample 4, the time-course change ratio is disadvantageously greater than 1.05. Thus, the $BaCO_3/BaO$ ratio is limited to about 0.42 or less.

When the lattice constant is less than 0.4020 nm as in Comparative Examples 1 and 2, the specific resistance at room temperature is disadvantageously higher than 100 $\Omega \cdot$cm and the withstanding voltage is disadvantageously less than 800 V/mm. Thus, the lattice constant is limited to about 0.4020 nm or more.

When the Ba/Ti ratio is less than 0.988 as in the case of Sample 6, the withstanding voltage is disadvantageously less than 800 V/mm, whereas when it is in excess of 0.995, the time-course change ratio is disadvantageously in excess of 1.05. Thus, the Ba/Ti ratio is limited to about 0.988–0.995.

Although La was used as a semiconductivity-imparting agent in the present Examples, no particular limitation is placed on the semiconductivity-imparting agent. For example, there may be used a rare earth element such as Y, Sm, Ce, or Dy; or a transition metal element such as Nb, Ta, or W.

As described hereinabove, the barium titanate powder according to the present invention has a cubic crystal system and a particle size of about 0.1 μm or less, wherein the ratio represented by $BaCO_3/BaO$ as obtained through XPS is about 0.42 or less; the lattice constant is about 0.4020 nm or more; and the ratio represented by Ba/Ti is about 0.988–0.995.

The semiconducting ceramic according to the present invention is formed of the above-described barium titanate powder and a semiconductivity-imparting agent, to thereby provide a withstanding voltage of 800 V/mm or more and a specific resistance at room temperature of 100 Ω·cm or less, the specific resistance at room temperature undergoing substantially no time-course change.

What is claimed is:

1. A cubic crystal system barium titanate powder having an average particle size of about 0.1 μm or less, a XPS ratio of $BaCO_3/BaO$ of about 0.42 or less, z lattice constant of about 0.4020 nm or more, and a ratio of Ba/Ti of about 0.988–0.995.

2. A mixture for forming a semiconducting ceramic comprising the barium titanate powder of claim 1 and a semiconductivity-imparting agent.

3. The mixture of claim 2 comprising a La-containing barium titanate powder.

4. A semiconducting ceramic comprising the sintered mixture of claim 3.

5. A semiconducting ceramic electronic element which comprises the semiconducting ceramic of claim 4 having electrodes thereon.

6. A semiconducting ceramic comprising the sintered mixture of claim 2.

7. A semiconducting ceramic electronic element which comprises the semiconducting ceramic of claim 6 having electrodes thereon.

* * * * *